(12) United States Patent
Cho

(10) Patent No.: US 6,781,293 B2
(45) Date of Patent: Aug. 24, 2004

(54) ORGANIC EL DEVICE WITH HIGH CONTRAST RATIO AND METHOD FOR MANUFACTURING THE SAME

(75) Inventor: Sung-Woo Cho, Sungnam (KR)

(73) Assignee: Samsung SDI Co., Ltd., Suwon (KR)

( * ) Notice: Subject to any disclaimer, the term of this patent is extended or adjusted under 35 U.S.C. 154(b) by 183 days.

(21) Appl. No.: 09/970,993

(22) Filed: Oct. 5, 2001

(65) Prior Publication Data

US 2002/0043928 A1 Apr. 18, 2002

(30) Foreign Application Priority Data

Oct. 14, 2000 (KR) .......................................... 2000-60524

(51) Int. Cl.[7] .............................. H01J 1/05; H01J 1/62; B05D 5/06
(52) U.S. Cl. ........................ 313/311; 313/498; 313/503; 313/505; 313/506; 315/169.3; 427/66
(58) Field of Search ................................. 313/311, 498, 313/503, 505, 506; 315/169.3; 427/66

(56) References Cited

U.S. PATENT DOCUMENTS

| 5,294,869 A | * | 3/1994 | Tang et al. | 313/505 |
| 5,543,683 A | * | 8/1996 | Haven et al. | 313/461 |
| 6,370,019 B1 | * | 4/2002 | Matthies et al. | 315/169.3 |

* cited by examiner

Primary Examiner—Sharlene L Leurig
(74) Attorney, Agent, or Firm—McGuireWoods LLP

(57) ABSTRACT

The present invention discloses an organic EL device, including: a transparent substrate having a display region and a non-display region, the display region having a pixel region; first electrodes formed on the display region of the substrate and spaced apart from each other; EL light-emitting layers formed on the portions of the first electrode corresponding to the pixel region; and second electrodes formed over the display region and having a light absorbing layer interposed therein.

21 Claims, 6 Drawing Sheets

ORGANIC EL DEVICE WITH HIGH CONTRAST RATIO AND METHOD FOR MANUFACTURING THE SAME

BACKGROUND OF THE INVENTION

1. Field of the Invention

The present invention relates to an organic EL Device and a method for manufacturing the same.

2. Description of Related Art

FIG. 1 is a cross-sectional view illustrating a conventional organic EL device. As shown in FIG. 1, the organic EL device includes a first electrode or anode electrode 13 formed on a substrate 11 and a second electrode or cathode electrode 15 with an EL light-emitting layer 17 interposed therebetween.

A method for manufacturing such an organic EL device is as follows. First, an indium-tin oxide (ITO) film is formed all over a front surface of a glass substrate in a vacuum atmosphere. Then, the ITO film is formed into a stripe-like shape by etching, forming a plurality of transparent electrodes or first electrodes 13 arranged side by side but spaced apart from each other at predetermined intervals. Then, the EL light-emitting layer 17 is formed on the first electrode 13. The EL light-emitting layer 17 includes a hole transport layer, a luminescent layer, and an electron transport layer, laminated in sequence and sandwiched between an anode and a cathode.

The hole transport layer, which is made of a hole transport material such as a triphenylamine derivative (TPD) or the like, is formed on the transparent electrodes by vacuum deposition. Subsequently, a layer made of an electron transport material such as an aluminum quinolinol complex ($Alq_3$) acting as a luminous material is laminated on the hole transport layer, resulting in a luminous material layer being formed by vacuum deposition. Then, material such as Al, Li, Ag, Mg, In is deposited in a stripe-like manner on the luminous material layer so as to extend in a direction perpendicular to a pattern of the transparent electrodes, to thereby provide a plurality of rear electrodes or second electrodes 15. In such a construction, portions of the luminous material layer positioned at intersections between the transparent electrodes and the rear electrodes define luminous sections, in forming a dot matrix. The organic EL device thus constructed flows current to the luminous sections positioned on the intersections between the transparent electrodes acting as anodes and the rear electrodes acting as cathodes, illuminating the luminous sections.

However, the organic EL device having such a configuration has a problem of low contrast, because ambient light is reflected from the second electrode 15 made of a metal.

In order to overcome the problem described above, as shown in FIG. 2, a retardation film 19 and a polarizer 18 are sequentially arranged on a lower surface of the substrate 11, which. At this point, the retardation film is made of λ/4 plate. The polarizer 18 and the retardation film 19 causes a phase difference in ambient light reflected from the cathode electrode 15, leading to a destructive interference, whereupon ambient light is blocked. In other words, the first quarter-wave plate and the polarizer cooperatively work as a circularly polarizer plate that can absorb light reflected from the cathode electrode, thus reducing reflection.

However, the polarizer 18 and the retardation film 19 lowers a light transmittance to be less than about 50%. As a result, a brightness of the organic EL device is as lowered as about 50%.

SUMMARY OF THE INVENTION

To overcome the problems described above, preferred embodiments of the present invention provide an organic EL device having a high contrast ratio and a high brightness.

In order to achieve the above object, the preferred embodiments of the present invention provide an organic EL device. A transparent substrate has a display region and a non-display region. The display region has pixel regions. First electrodes are formed on the display region of the substrate and spaced apart from each other. EL light-emitting layers are formed on the portions of the first electrode corresponding to the pixel region. Second electrodes are formed over the display region and have a light absorbing layer interposed therein.

Further, an interlayer insulator is formed over a portion of the display region except for portions of the first electrode corresponding to the pixel region, and overhanging shaped partition walls are formed on the interlayer insulator in a perpendicular direction to the first electrodes.

The preferred embodiment of the present invention provides a method for manufacturing an organic EL device. The method includes a) providing a transparent substrate having a display region and a non-display region, the display region having a pixel region; b) forming first electrodes formed on the substrate, the first electrode spaced apart from each other; c) forming EL light-emitting layers on the portions of the first electrode corresponding to the pixel region; and d) forming second electrodes over the display region, the second electrode having a light absorbing layer interposed therein.

The method further includes, after the step of (b), forming interlayer insulator, the interlayer insulator over a portion of the display region except for portions of the first electrode corresponding to the pixel region; forming partition walls on the interlayer insulator in a perpendicular direction to the first electrodes.

The second electrode includes first and second layers with the light absorbing layer interposed therebetween. The first layer is adjacent to the EL light-emitting layer ID and has a thin thickness sufficiently to transmit part of ambient light. The first layer of the second electrode is less than about 100 Å thicks. The second layer is thicker than the first layer. The black layer of the second electrode is disposed on a location corresponding to the pixel region. The black layer is made of a material absorbing ambient light. The black layer is made of one of carbon, an inorganic material, and an organic material. The organic EL device further includes cathode leads formed on the non-display region of the substrate and electrically connected with the second electrode. The interlayer insulator includes a contact hole, and the cathode leads are electrically connected to the second electrode through the contact hole. The first electrode is made of indium tin oxide (ITO). The second electrode is made of one of Al, Li, Mg, Ag, Ca, Ba, and so on.

Since ambient light is partially transmitted through the thin first layer of second electrode and is subsequently absorbed by the black layer, the contrast ratio increases, leading to higher brightness.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF PREFFERED EMBODIMENTS

A preferred embodiment of the present invention will be described in more detail, referring to the accompanying drawings.

Figure 1:
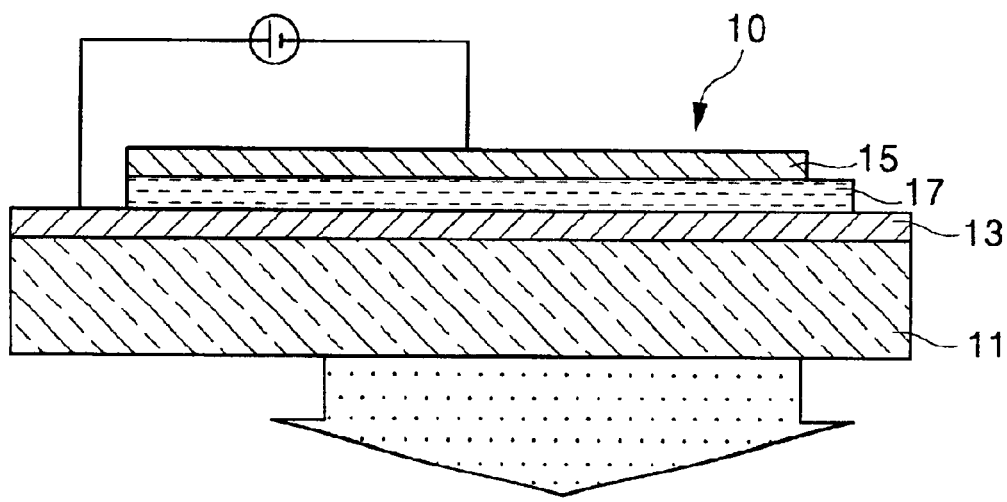
FIG. 1 is a cross-sectional view illustrating a configuration of a conventional organic EL device.
Figure 2:
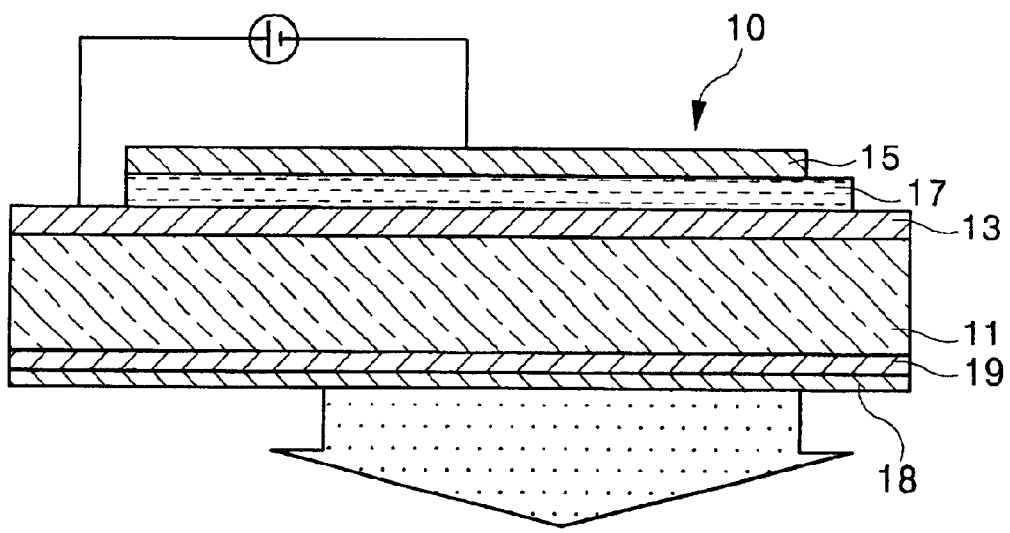
FIG. 2 is a cross-sectional view illustrating a modified configuration of the conventional organic EL device.
Figure 3A:
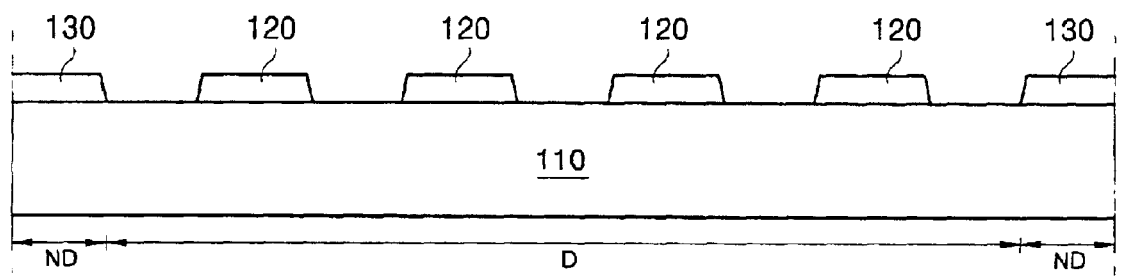
FIGS. 3A to 3F are cross-sectional view illustrating a process of manufacturing a passive matrix organic EL device according to a preferred embodiment of the present invention.
Figure 3B:
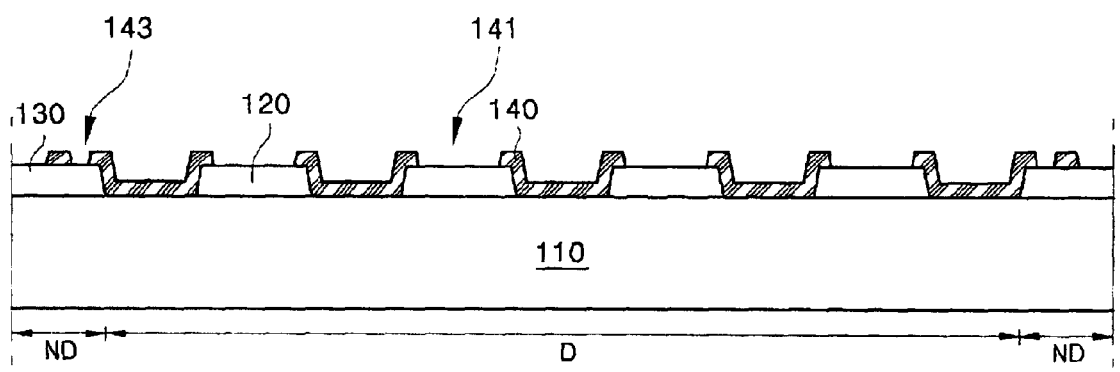
Figure 3C:
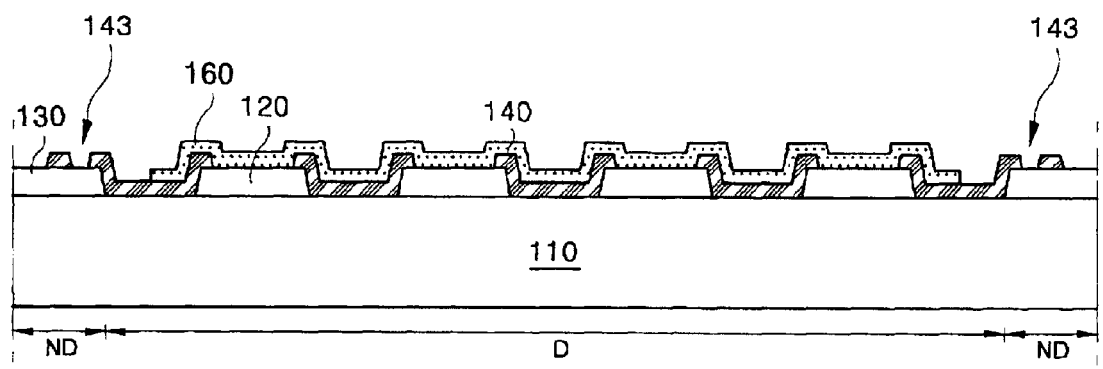
Figure 3D:
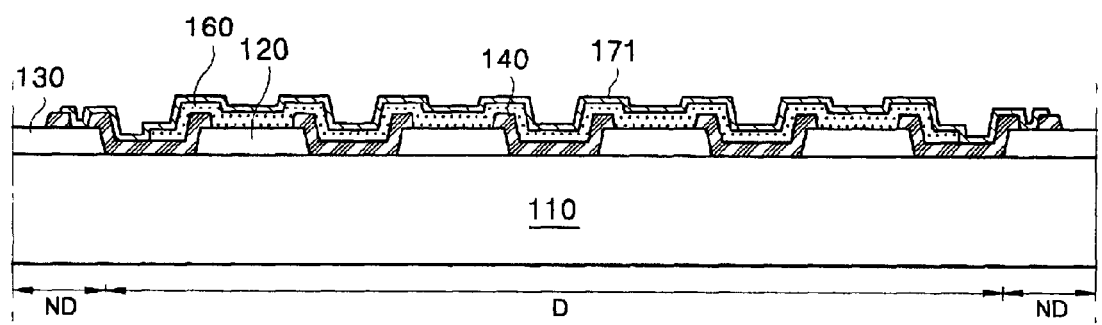
Figure 3E:
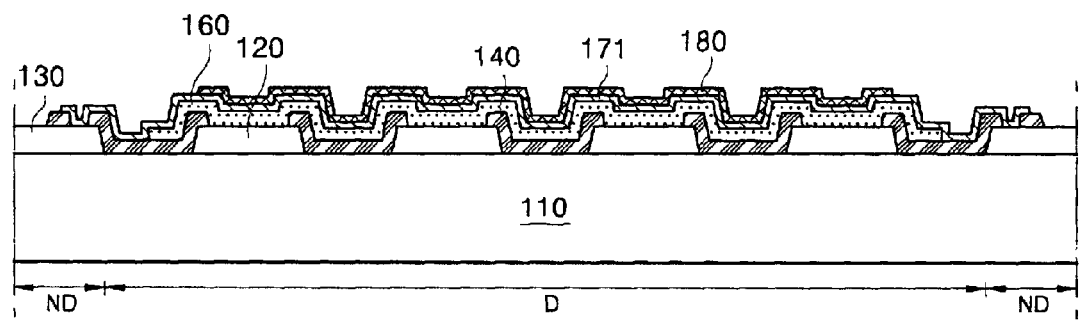
Figure 3F:
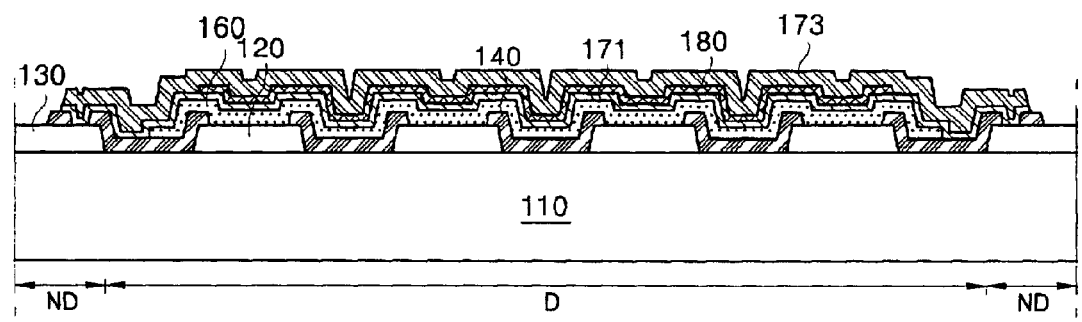

FIG. 3F is a cross-sectional view illustrating a passive matrix organic EL device according to the preferred embodiment of the present invention. As shown in FIG. 3F, a plurality of stripe-like shaped anode electrodes 120 are formed on a transparent substrate 110 spaced apart from each other at a predetermined interval. At this point, the transparent substrate 110 includes a display region D and a non-display region ND, and the display region D has a plurality of pixel region 141 (see FIG. 3B). Cathode leads 130 are formed on the non-display region ND in a perpendicular direction to the anode electrode 120. Interlayer insulators 140 cover the entire display region D except for the pixel region 141 and overlap an end portion of the cathode lead 130. The interlayer insulator 140 serves to insulate the adjacent two anode electrodes 120 and to define the pixel region 141. The interlayer insulator 140 includes a contact hole 143 (see FIG. 3B) on a portion of the cathode lead 130. At this point, the interlayer insulator 140 is made of a photoresist, SiNx, SiOx, or the like. An EL light-emitting layers 160 is formed on the anode electrode 120. The EL light-emitting layer 160 includes a hole transport layer, a luminescent layer, and an electron transport layer. A first cathode electrode 171 and a second cathode electrodes 173 are formed on the EL light-emitting is layer 160 with a black layer 180 (i.e., light absorbing layer) interposed therebetween. The first cathode electrode 171 is thin (e.g., less than 100 Å) sufficiently to transmit part of ambient light, while the second cathode electrode 173 has a relatively thick thickness. The first cathode electrode 171 and the second cathode electrode 173 are made of one of Al, Mg, Ag, Ca, Ba, and the like, and are electrically connected to the cathode lead 130 through the contact hole 143. The black layer 180, which is made of carbon, an inorganic or an organic material, absorbs ambient light that passes through the first cathode electrode, thereby preventing a reflection of ambient light. As a result, a contrast ratio and brightness of the organic EL device are enhanced.

Hereinafter, a method for manufacturing the passive matrix organic EL device according to the preferred embodiment of the present invention is explained in detail with reference to FIGS. 3A through 3F First, as shown in FIG. 3A, a first electrode layer is formed on the substrate and patterned into the anode electrodes 120 and the cathode leads 130. Preferably, the anode electrodes 120 and the cathode leads 130 are made of indium thin oxide (ITO).

As shown in 3B, an insulating material layer is formed and patterned into the interlayer insulator 140. A portion of the anode electrode 120 corresponding to the pixel region 141 is exposed, and the interlayer insulator 140 overlaps an end portion of the anode electrodes 120. The interlayer insulator 140 has the contact hole 143 formed on a portion of the cathode lead 130. Subsequently, as shown in FIG. 3C, the EL light-emitting layer 160 is formed over a portion of the display region D while covering the interlayer insulator 140.

Then, as shown in FIG. 3D, the first cathode electrode 171 are formed on the EL light-emitting layer 160 and connected to the cathode lead 130 through the contact hole 143. The first cathode electrode 171 has a thin thickness sufficiently to transmit part of the ambient light and preferably has a thickness of less than 100 Å.

Next, as shown in FIG. 3E, the black layer 180 is formed on a portion of the first cathode 171 corresponding to the EL light-emitting layer 160 except for portions of the contact holes 143. The black layer 180 is made of a material of absorbing the visible ray. It is preferable to use carbon, an inorganic or an organic material to absorb the ambient light, thereby preventing a reflection of the ambient light from the cathode electrode.

Finally, as shown in FIG. 3F, the second cathode electrode 173 are formed on the first cathode electrode 171 covering the cathode contact hole region 143 while the black layer 180 is formed on the first cathode electrode 171 except for the cathode contact hole 143. The second cathode electrode 173 is thicker (e.g., hundreds to thousands Å) than the first cathode electrode 171. The first cathode electrode 171 and the second cathode electrode 173 are made of Al, Mg, Ag, Ca, Ba, or the like. Therefore, most components of the organic EL device according to the preferred embodiment of the present invention are completed.

Figure 4:
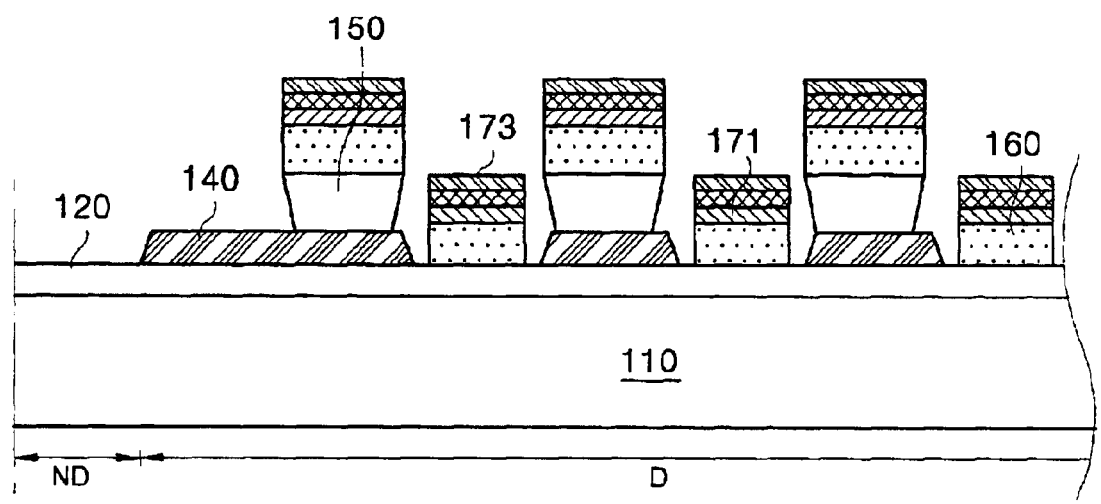
FIG. 4 is a cross-sectional view illustrating a passive matrix organic EL device having partition walls according to the preferred embodiment of the present invention and FIG. 5 is a cross-sectional view illustrating an active matrix organic EL device according to the preferred embodiment of the present invention.

Meanwhile, as shown in FIG. 4, the passive matrix organic EL device can have partition walls. In this case, the partition walls 150 are formed on the interlayer insulator 140 in a perpendicular direction to the anode electrode. The partition walls 150 are made of a photoresist, SiNx, SiOx, or the like. Since the partition walls are previously formed by conventional photolithographic process, there is no need for using fine shadow masks to deposit patterned cathodes, and it is possible to prevent the short circuit of the adjacent two cathodes.

Until now, the present invention is explained focusing on the passive matrix organic EL device, but it can be understood that the present invention can be applied to an active matrix organic EL device.

Figure 5:
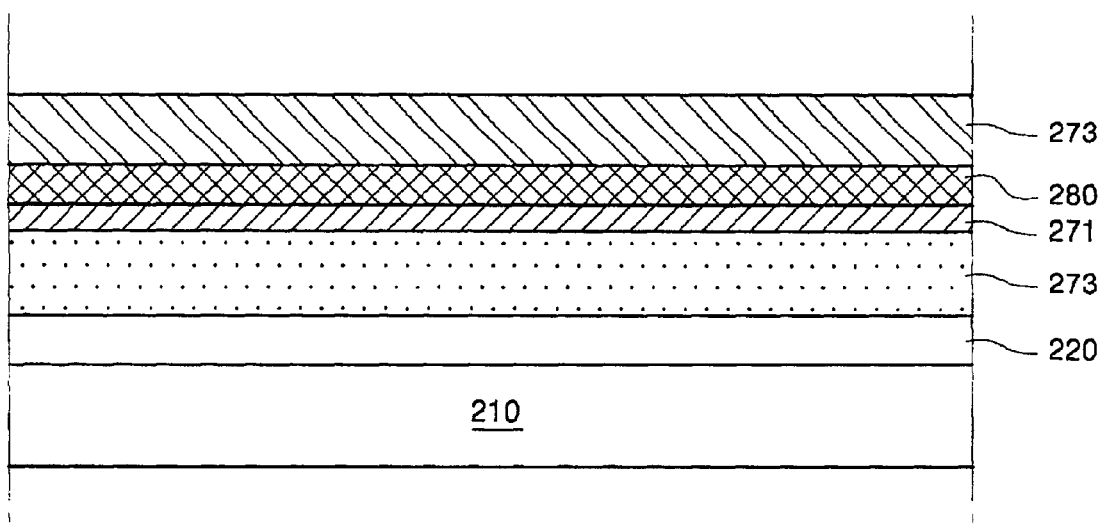

FIG. 5 is a cross-sectional view illustrating the active matrix organic EL device according to the preferred embodiment of the present invention. As shown in FIG. 5, a light absorbing layer 280 is formed between first and second cathode electrodes 271 and 273 corresponding to an EL light-emitting layer 260. In FIG. 5, reference numerals 210 and 220 denote a substrate and an anode electrode, respectively.

As described herein before, since ambient light partially transmitted through the thin first layer of cathode electrode is subsequently absorbed by the black layer, the contrast ratio increases, achieving higher brightness.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An organic EL device, comprising:
   a transparent substrate having a display region and a non-display region, the display region having a pixel region;
   first electrodes formed on the display region of the substrate and spaced apart from each other;
   EL light-emitting layers formed on portions of the first electrode corresponding to the pixel region; and
   second electrodes formed over the EL light-emitting layers and comprising a first layer, a second layer and a light absorbing layer interposed between the first layer and the second layer.

2. The device of claim 1, wherein the first layer is adjacent to the EL light-emitting layer and thin enough to transmit part of ambient light.

3. The device of claim 2, wherein the first layer is less than about 100 Å thick.

4. The device of claim 2, wherein the second electrode is thicker than the first electrode.

5. The device of claim 1, wherein the light absorbing layer of the second electrode is disposed on a location corresponding to the pixel region.

6. The device of claim 1, wherein the light absorbing layer is made of a material absorbing ambient light.

7. The device of claim 6, wherein the light absorbing layer is made of carbon, an inorganic material or an organic material.

8. The device of claim 1, further comprising cathode leads formed on the non-display region of the substrate and electrically connected to the second electrode.

9. The device of claim 8, further comprising an interlayer insulator formed on the substrate between said first electrodes, wherein the interlayer insulator includes a contact hole, and the cathode leads are electrically connected to the second electrode through the contact hole.

10. The device of claim 1, wherein the first electrode is made of indium tin oxide (ITO).

11. The device of claim 1, wherein the second electrode is made of low work function metal such as Al, Li, In, Mg, Ag, Ca or Ba.

12. The device of claim 1, further comprising:
    an interlayer insulator formed over a portion of the display region except for portions of the first electrode corresponding to the pixel region; and
    partition walls formed on the interlayer insulator in a perpendicular direction to the first electrodes.

13. A method for manufacturing an organic EL device, comprising:
    a) forming first electrodes spared apart from each other on a transparent substrate having a display region with a pixel region and a non-display region;
    b) forming an EL light-emitting layer on the portions of the first electrode corresponding to the pixel region; and
    c) forming second electrodes with a light absorbing layer therein over the display region.

14. The method of claim 13, wherein the step of forming second electrodes further comprising steps of:
    forming a first layer on the EL light-emitting layer;
    forming the light absorbing layer on the first layer; and
    forming a second layer on the light absorbing layer.

15. The method of claim 13, wherein the first layer is thin enough to transmit part of ambient light.

16. The method of claim 15, wherein the first layer of the second electrode is less than about 100 Å thick.

17. The method of claim 15, wherein the second electrode is thicker than the first electrode.

18. The method of claim 13, wherein the light absorbing layer of the second electrode is disposed on a location corresponding to the pixel region except for the cathode contact hole region.

19. The method of claim 13, wherein the light absorbing layer is made of a material absorbing ambient light.

20. The method of claim 19, wherein the light absorbing layer is made of carbon, an inorganic material or an organic material.

21. The method of claim 20, further comprising, after the step of (a), the steps of:
    forming an interlayer insulator over a portion of the display region except for portions of the first electrode corresponding to the pixel region; and
    forming partition walls on the interlayer insulator in a direction perpendicular to the first electrodes.

* * * * *